US006411492B1

United States Patent
Kar-Roy et al.

(12) United States Patent
(10) Patent No.: US 6,411,492 B1
(45) Date of Patent: Jun. 25, 2002

(54) STRUCTURE AND METHOD FOR FABRICATION OF AN IMPROVED CAPACITOR

(75) Inventors: Arjun Kar-Roy; Phil N. Sherman, both of Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/578,229

(22) Filed: May 24, 2000

(51) Int. Cl.$^7$ .............................................. H01G 4/008
(52) U.S. Cl. .................... 361/305; 361/306.3; 361/321; 361/311; 361/306.1; 438/386; 438/387; 257/306; 257/307
(58) Field of Search .............................. 361/305, 321.5, 361/301.3, 306.1, 306.3, 312, 311; 438/238, 239, 386, 387; 257/306, 307

(56) References Cited

U.S. PATENT DOCUMENTS

| | | | | |
|---|---|---|---|---|
| 5,071,363 A | * | 12/1991 | Reylek et al. ............... | 439/291 |
| 5,200,580 A | * | 4/1993 | Sienski ....................... | 174/264 |
| 5,583,359 A | * | 12/1996 | Ng et al. .................... | 257/306 |
| 5,822,175 A | * | 10/1998 | Azuma ....................... | 361/321.5 |
| 5,933,947 A | * | 8/1999 | Minamizawa et al. ......... | 29/847 |
| 6,124,163 A | * | 9/2000 | Shirley et al. ............... | 438/238 |
| 6,125,027 A | * | 9/2000 | Klee et al. ................... | 361/320 |
| 6,198,170 B1 | * | 3/2001 | Zhao .......................... | 257/784 |

* cited by examiner

Primary Examiner—Dean A. Reichard
Assistant Examiner—Nguyen Ha
(74) Attorney, Agent, or Firm—Farjami & Farjami LLP

(57) ABSTRACT

Structure and method for fabrication of an improved capacitor are disclosed. In one embodiment, the disclosed capacitor includes a metal column comprising a number of interconnect metal segments and a number of via metal segments stacked on one another. The metal column constitutes one electrode of the capacitor. Another electrode of the capacitor is a metal wall surrounding the metal column. In one embodiment, the metal wall is fabricated from a number of interconnect metal structures and a number of via metal structures stacked on one another. In one embodiment, the metal wall is shaped as a hexagon. In this embodiment, a tight packing arrangement is achieved by packing individual hexagonal capacitors "wall to wall" so as to achieve a cluster of individual hexagonal capacitors. The cluster of individual capacitors acts as a single composite capacitor. In one embodiment, the interconnect metal and via metal are both made of copper. In another embodiment, the interconnect metal is made of copper while the via metal is made of tungsten.

16 Claims, 5 Drawing Sheets

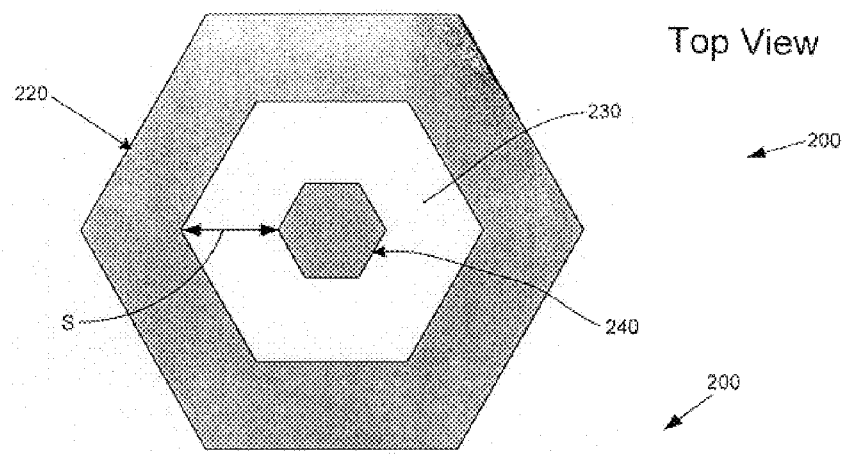
FIG. 2A  Top View
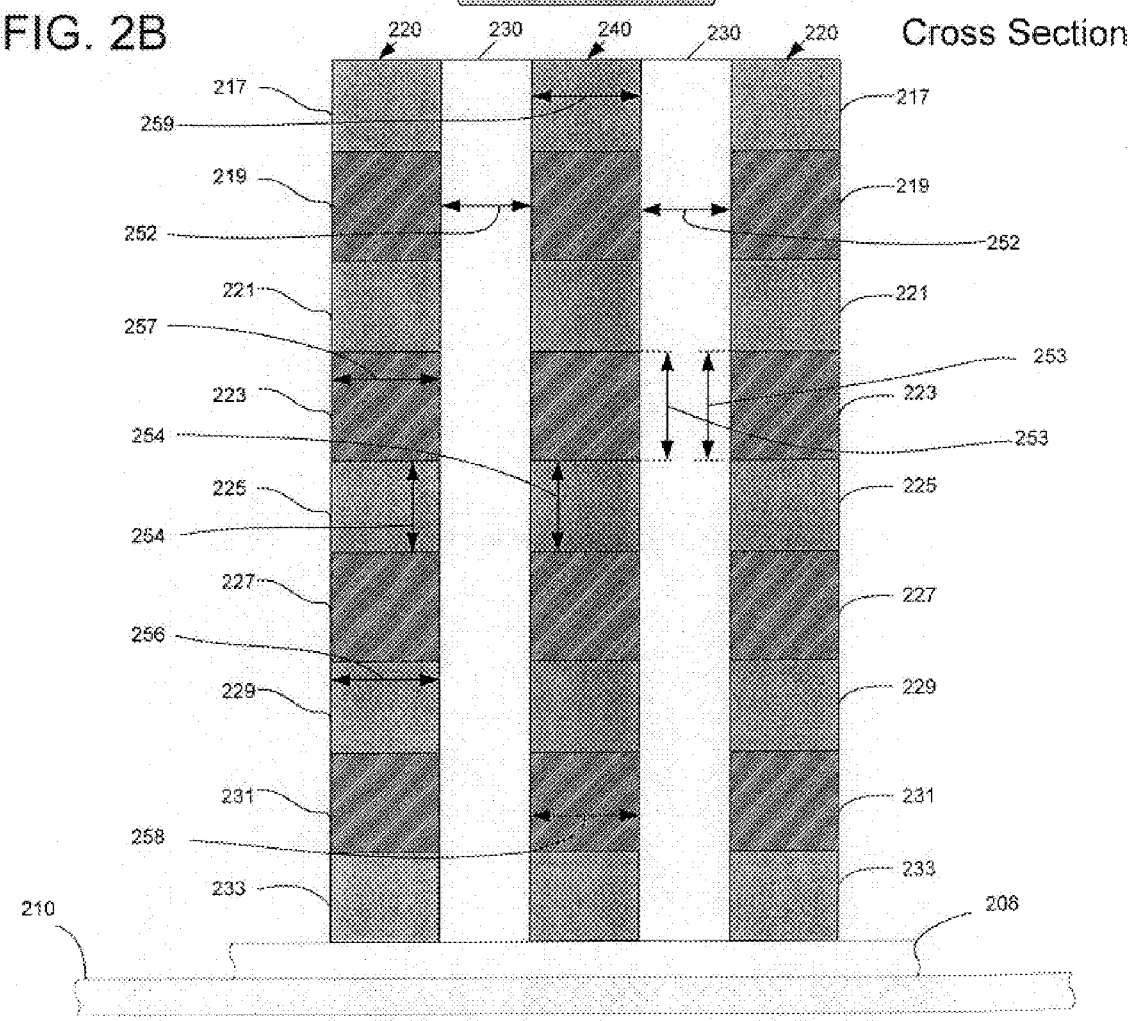
FIG. 2B  Cross Section

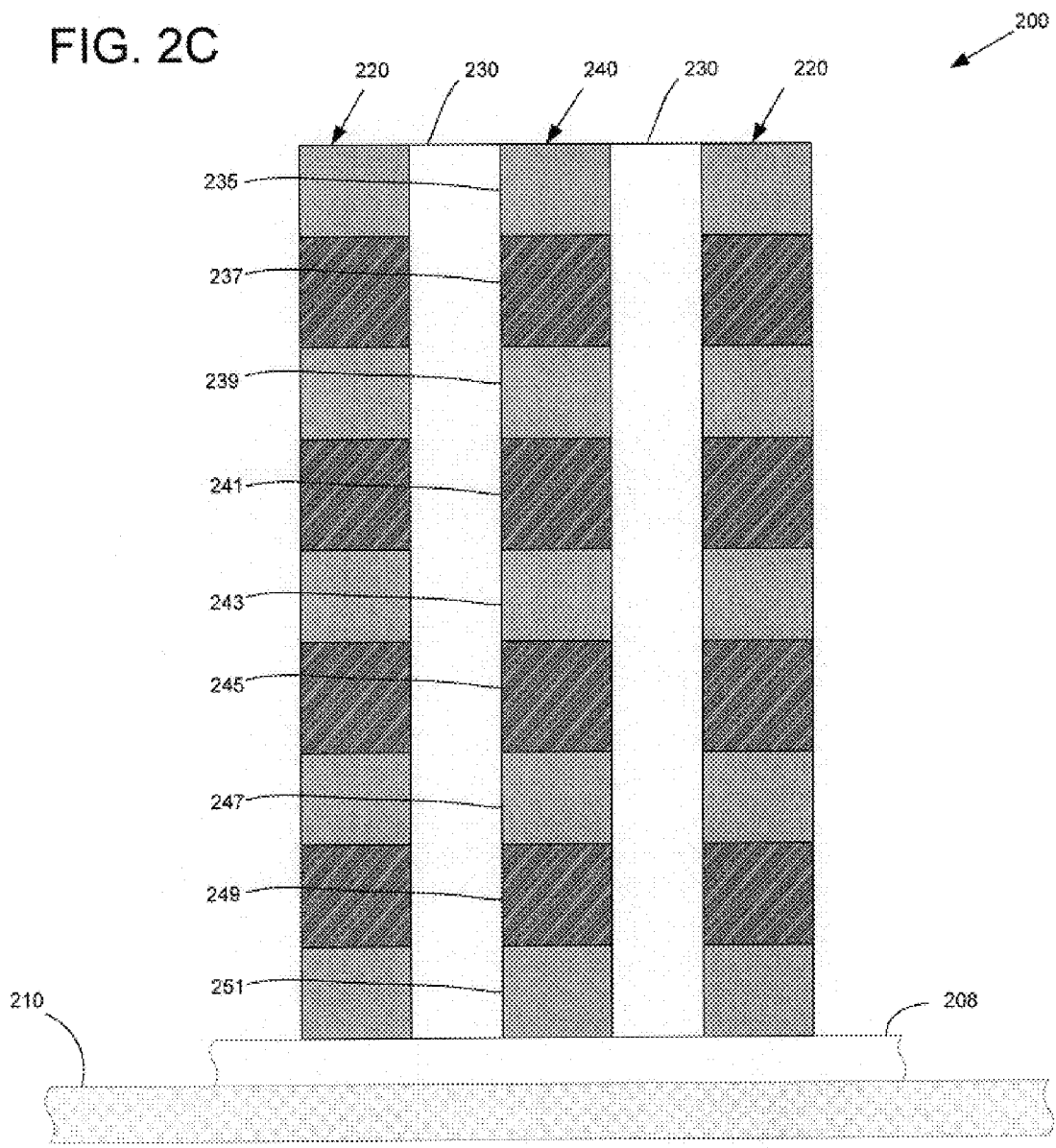

STRUCTURE AND METHOD FOR FABRICATION OF AN IMPROVED CAPACITOR

BACKGROUND OF THE INVENTION

The present application is related to a co-pending application entitled "An Improved Capacitor In Semiconductor Chips", filed on Feb. 10, 2000, Ser. No. 09/502,418, and assigned to the assignee of the present application. The disclosure in that co-pending application is hereby fully incorporated by reference into the present application.

1. Field of the Invention

The present invention is generally in the field of semiconductor chips. In particular, the invention is in the field of capacitors used in semiconductor chips.

2. Background Art

FIG. 1 shows a cross section of a conventional parallel plate capacitor 100. A dielectric layer 104 is shown as sandwiched between top plate 102 and bottom plate 106. Top plate 102 is typically made of conductive material such as titanium nitride while bottom plate 106 is typically made of a different conductive material such as aluminum/copper. Bottom plate 106 might rest on a dielectric layer such as inter-layer dielectric ("ILD") 108 which in turn rests on a metal layer or a semiconductor substrate. By way of example, FIG. 1 shows that ILD 108 rests on semiconductor substrate 110.

It is well known that the capacitance value of a parallel plate capacitor, such as parallel plate capacitor 100, is calculated by the equation:

$$C = \frac{\varepsilon_0 \varepsilon_r A}{t} \qquad \text{(Equation 1)}$$

where $\varepsilon_0$ is the permittivity of the free space ($\varepsilon_0 = 8.85 \times 10^{-14}$ F/cm), $\varepsilon_r$ is the relative permittivity (also referred to as dielectric constant or "k"), A is the surface area of plate 102 (or plate 106) and t is the thickness of dielectric layer 104.

Given the capacitance Equation 1, device engineers can increase capacitance by either decreasing the dielectric thickness t, using material with a high dielectric constant $\varepsilon_r$, or increasing the surface area A. However, device engineers have to work with the physical design limitations and electrical requirements in the circuit when adjusting the variables in capacitance Equation 1 in their attempt to increase capacitance.

Device engineers need a way to increase the capacitance without taking up the limited device surface area. As shown in FIG. 1, in parallel plate capacitor 100, plates 102 and 106 are laid out in parallel to the surface of semiconductor substrate 110. The size of parallel plates 102 and 106 can be increased in order to increase the capacitance of parallel plate capacitor 100. However, it is undesirable to consume the already limited surface area of a semiconductor die for building large capacitors.

In fact, as geometries of active circuits in semiconductor dies decrease, it becomes less and less desirable to allocate large portions of semiconductor die surface area for building parallel plate capacitors such as capacitor 100. Thus, a major problem with prior art parallel plate capacitor 100 is the amount of surface area that the two plates 102 and 106 occupy.

Referring to Equation 1, since capacitance C is inversely proportional to the dielectric thickness t, another way to increase the capacitance is by decreasing the thickness of dielectric layer 104. However, process limitations such as an unacceptable increase in defect density of thin dielectrics prevent use of very thin dielectrics. Also, as dielectric layer 104 becomes thinner, capacitance of capacitor 100 increasingly becomes a function of the voltage across parallel plates 102 and 104. By decreasing the thickness of dielectric layer 104, parallel plate capacitor 100 manifests additional problems such as a low break down voltage and a high leakage current. A combination of all of these problems prevents use of very thin dielectrics in parallel plate capacitors such as capacitor 100.

Further, in a number of semiconductor applications, accurate "matching" of capacitors is necessary. Capacitors are matched if their absolute values can be determined and replicated with accuracy. With parallel plate capacitor 100, matching of capacitors is difficult since small variations in the thickness of thin dielectric 104 results in relatively large variations in the capacitance value. Moreover, due to the fact that dielectric 104 is thin and also due to the fact that top plate 102 is made of conductive material different from the conductive material of bottom plate 106, the capacitance of capacitor 100 is a relatively strong function of the voltage applied to the capacitor plates, i.e. the capacitor does not have good linearity.

Another disadvantage with present parallel plate capacitors such as capacitor 100 is that an extra mask and additional process steps are required so that dielectric 104 will be a certain thickness (for example, 100 to 1000 Angstroms). This is necessary to ensure that top plate 102 can be fabricated at a certain desired height relative to bottom plate 106. The extra mask and its associated extra processing steps increase fabrication costs of prior art parallel plate capacitor 100.

Thus, there is serious need in the art for a capacitor in semiconductor chips that has a high capacitance density, has good matching characteristics, has a high break down voltage, has good linearity and can be fabricated at reduced cost.

SUMMARY OF THE INVENTION

The present invention is structure and method for fabrication of an improved capacitor. The invention's capacitor overcomes the present need for a capacitor having a high capacitance density, good matching characteristics, a high break down voltage, good linearity and a reduced fabrication cost in semiconductor chips.

In one embodiment, the invention's capacitor includes a metal column comprising a number of interconnect metal segments and a number of via metal segments stacked on one another. The metal column constitutes one electrode of the invention's capacitor. Another electrode of the invention's capacitor is a metal wall surrounding the metal column. In one embodiment of the invention, the metal wall is fabricated from a number of interconnect metal structures and a number of via metal structures stacked on one another.

In one embodiment of the invention, the metal wall is shaped as a hexagon. In this embodiment, a tight packing arrangement is achieved by packing individual hexagonal capacitors "wall to wall" so as to achieve a cluster of individual hexagonal capacitors. The cluster of individual capacitors acts as a single composite capacitor.

In one embodiment, the interconnect metal and via metal are both made of copper. In another embodiment, the interconnect metal is made of copper while the via metal is made of tungsten.

BRIEF DESCRIPTION OF THE DRAWINGS

FIG. 2A shows a top view and FIG. 2B shows a cross-section view of one embodiment of the invention's capacitor.

FIG. 2C shows the same side view of one embodiment of the invention's capacitor which was shown in FIG. 2B.

DETAILED DESCRIPTION OF THE INVENTION

Figure 1:
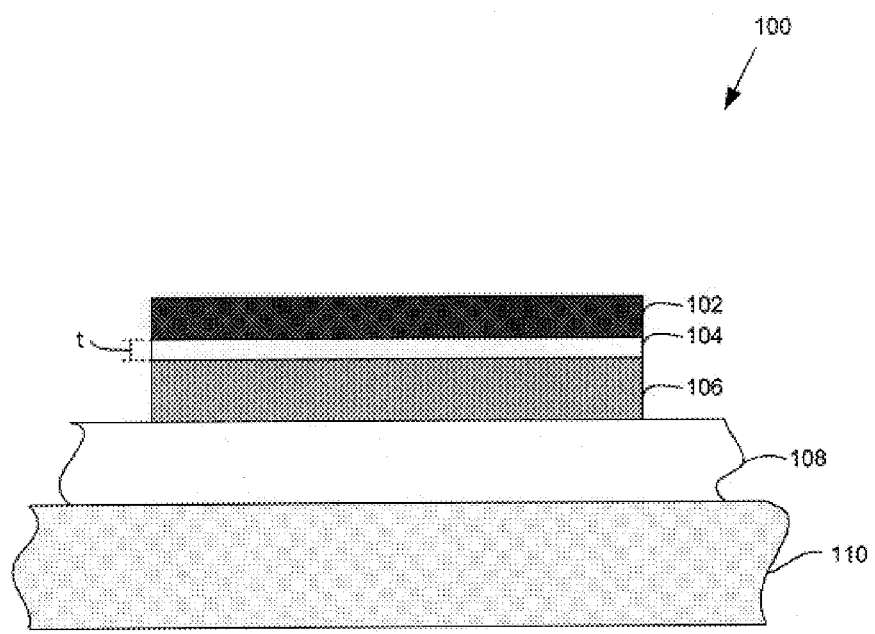
FIG. 1 shows a prior art parallel plate capacitor.

The present invention discloses structure and method for fabrication of an improved capacitor. The following description contains specific information pertaining to different types of materials, layouts, dimensions, and implementations of the invention's capacitor. One skilled in the art will recognize that the present invention may be practiced with material, layouts, dimensions, and implementations different from those specifically discussed in the present application. Moreover, some of the specific details of the invention are not discussed in order to not obscure the invention. The specific details not discussed in the present application are within the knowledge of a person of ordinary skill in the art.

The drawings in the present application and their accompanying detailed description are directed to merely example embodiments of the invention. To maintain brevity, other embodiments of the invention which use the principles of the present invention are not specifically described in the present application and are not specifically illustrated by the present drawings.

FIG. 2A illustrates a top view of an embodiment of capacitor 200 of the present invention while FIG. 2B illustrates a cross-section view of the embodiment of capacitor 200 whose top view is shown in FIG. 2A. The top view of capacitor 200 shown in FIG. 2A consists of a top view of a metal wall, which is generally referred to by numeral 220 in FIG. 2A, and a top view of a metal column, which is generally referred to by numeral 240 in FIG. 2A. The cross-section view of capacitor 200 shown in FIG. 2B illustrates a cross-section view of the metal wall, which is generally referred to by numeral 220 in FIG. 2B. Cross section view of metal wall 220 shown in FIG. 2B corresponds to the top view of metal wall 220 in FIG. 2A. The cross-sectional view of capacitor 200 shown in FIG. 2B also includes a cross-section view of metal column 240 in FIG. 2B. The cross section view of metal column 240 shown in FIG. 2B corresponds to the top view of metal column 240 in FIG. 2A.

Referring to FIG. 2A, in the present embodiment of the invention, metal wall 220 is a continuous metal wall as shown in the top view of capacitor 200. Metal wall 220 is fabricated around metal column 240 at a distance referred to in FIG. 2A and elsewhere in the present application as "distance S" or simply as "S".

As seen from the top view of capacitor 200 in FIG. 2A, in the present embodiment of the invention metal wall 220 is fabricated with a hexagonal shape and will also be referred to as "hexagonal metal wall" 220 in the present application. Hexagonal metal wall 220 is fabricated out of various interconnect metal layers and via metal in a semiconductor chip. Metal column 240 is fabricated as a column centered within and surrounded by hexagonal metal wall 220. Metal column 240 is fabricated out of various interconnect metal layers and via metal in a semiconductor chip. In the present embodiment of the invention metal column 240 is fabricated with a hexagonal shape and will also be referred to as a "hexagonal metal column" 240 in this application. The six sides of hexagonal metal column 240 are each parallel to the six respective sides of surrounding hexagonal metal wall 220.

Although typically vias on a semiconductor chip are circular or square in shape or consist of a group of such shapes, in the present embodiment of the invention's capacitor continuous hexagonal vias are etched into the dielectric layer, i.e. the via metal structures would be hexagonal in shape and would be similar in configuration to the interconnect metal structures. By fabricating continuous hexagonal interconnect metal and via metal structures the capacitance density is improved, as will be discussed further in a later section of the present application.

Although in the present embodiment of the invention metal wall 220 and metal column 240 are hexagonal in shape, other shapes could be used without departing from the spirit and scope of the invention. For example, instead of being shaped as a hexagon, metal wall 220 could be shaped as a circle, rectangle, square or other polygon.

Referring to FIGS. 2A and 2B, it is shown that a dielectric material is situated between and completely fills the space between hexagonal metal wall 220 and hexagonal metal column 240. This dielectric material, also referred to as a dielectric wall in the present application, is generally referred to in FIGS. 2A and 2B by numeral 230. In the present embodiment of the invention dielectric wall 230 is made of silicon oxide, although other dielectric materials could be used. FIG. 2B shows merely a cross-section view of dielectric wall 230. To maintain brevity, that cross-section view is referred to as dielectric wall 230.

Referring to FIG. 2B, it is shown that capacitor 200 rests on an inter-layer dielectric 208 which in turn rests on a semiconductor substrate 210 in a semiconductor die (the semiconductor die is not shown in any of the Figures). Although it is not the case in the embodiment of the invention shown in FIG. 2B, capacitor 200 may rest on a particular metal layer instead of resting on inter-layer dielectric 208 shown in FIG. 2B. Semiconductor substrate 210 is typically made of silicon, while inter-layer dielectric 208 is typically made of silicon dioxide.

As stated above, FIG. 2B shows respective cross-sections of hexagonal metal wall 220 and hexagonal metal column 240. The cross-section views of hexagonal metal wall 220 and hexagonal metal column 240 are also referred to as hexagonal metal wall 220 and hexagonal metal column 240 for brevity, although only a cross-section view of the respective metal wall and metal column are shown. Hexagonal metal wall 220 and hexagonal metal column 240 are fabricated perpendicular to dielectric layer 208 and semiconductor substrate 210. Similarly, FIG. 2B shows merely a cross-sectional view of dielectric wall 230. To maintain brevity, that cross-section view is also referred to as dielectric wall 230 in the present application.

As shown in FIG. 2B, hexagonal metal wall 220 is comprised of interconnect metal structures 217, 221, 225, 229, and 233 and via metal structures 219, 223, 227, and 231, which are stacked on one another. Structure 233 in hexagonal metal wall 220 is made of interconnect metal layer one and forms the base of hexagonal metal wall 220. Structure 229 is made of interconnect metal layer two and is connected to structure 233 through structure 231. Structure 231 is made from via metal and connects interconnect metal layer one structure 233 with interconnect metal layer two structure 229. Structure 225 is made of interconnect metal layer three and is connected to structure 229 through structure 227. Structure 227 is made from via metal and connects interconnect metal layer two structure 229 with interconnect metal layer three structure 225. Structure 221 is made of interconnect metal layer four and is connected to structure 225 through structure 223. Structure 223 is made from via metal and connects interconnect metal layer three structure 225 with interconnect metal layer four structure 221.

Finally, structure 217 is made of interconnect metal layer five and is connected to structure 221 through structure 219. Structure 219 is made from via metal and connects interconnect metal layer four structure 221 with interconnect metal layer five structure 217. Interconnect metal layer five structure 217 is the final structure in hexagonal metal wall 220 and completes hexagonal metal wall 220.

It can be seen in FIG. 2B that interconnect metal structures 233, 229, 225, 221, and 217 of hexagonal metal wall 220 are in contact with and therefore electrically interconnected to via metal structures 219, 223, 227, and 231 of hexagonal metal wall 220. This hexagonal metal wall is utilized as one electrode of the present invention's capacitor.

FIG. 2C shows the identical cross-section views of hexagonal metal wall 220 and hexagonal metal column 240 which were shown in FIG. 2B. However, FIG. 2C is used to specifically discuss the various interconnect metal segments and via metal segments constituting metal column 240. As illustrated in FIG. 2C, hexagonal metal column 240 is comprised of interconnect metal segments 235, 239, 243, 249, and 251, and via metal segments 237, 241, 245, and 247, which are stacked on one another.

As shown in FIG. 2C, segment 251 in hexagonal metal column 240 is made of interconnect metal layer one and forms the base of hexagonal metal column 240. Segment 247 is made of interconnect metal layer two and is connected to segment 251 through segment 249. Segment 249 is made from via metal and connects interconnect metal layer one segment 251 with interconnect metal layer two segment 247. Segment 243 is made of interconnect metal layer three and is connected to segment 247 through segment 245. Segment 245 is made from via metal and connects interconnect metal layer two segment 247 with interconnect metal layer three segment 243. Segment 239 is made of interconnect metal layer four and is connected to segment 243 through segment 241. Segment 241 is made from via metal and connects interconnect metal layer three segment 243 with interconnect metal layer four segment 239.

Finally, segment 235 is made of interconnect metal layer five and is connected to segment 239 through segment 237. Segment 237 is made from via metal and connects interconnect metal layer four segment 239 with interconnect metal layer five segment 235. Interconnect metal layer five segment 235 is the final segment in hexagonal metal column 240 and completes hexagonal metal column 240.

It can be seen in FIG. 2C that interconnect metal segments 251, 247, 243, 239, and 235 of hexagonal metal column 240 are in contact with and therefore electrically interconnected to via metal segments 249, 245, 241, and 237 of hexagonal metal column 240. Hexagonal metal column 240 is utilized as another electrode of the invention's capacitor.

Referring again to FIG. 2B, the thickness of dielectric wall 230 is referred to by numeral 252 and is approximately 0.25 microns in the present embodiment of the invention. A typical thickness for the various interconnect metal layers used to fabricate interconnect metal structures 233, 229, 225, 221, and 217 of hexagonal metal wall 220 and interconnect metal segments 251, 247, 243, 239 and 235 of hexagonal metal column 240 is generally referred to by numeral 254 and is approximately 0.5 microns in the present embodiment of the invention. A typical thickness of metal used in via metal structures 231, 227, 223, and 219 of hexagonal metal wall 220 and via metal segments 249, 245, 241, and 237 of hexagonal metal column 240 is generally referred to by numeral 253 and is approximately 0.8 microns in the present embodiment of the invention. The width of interconnect metal structures 233, 229, 225, 221, and 217 of hexagonal metal wall 220 is generally referred to by numeral 256 and is approximately 0.25 microns in the present embodiment of the invention. The width of via metal structures 231, 227, 223, and 219 of hexagonal metal wall 220 is generally referred to by numeral 257 and is also approximately 0.25 microns in the present embodiment of the invention. The width of via metal segments 249, 245, 241, and 237 of hexagonal metal column 240 is generally referred to by numeral 258 and is approximately 0.25 microns in the present embodiment of the invention. The width of interconnect metal segments 251, 247, 243, 239, and 235 of hexagonal metal column 240 is generally referred to by numeral 259 and is also approximately 0.25 microns in the present embodiment of the invention.

As mentioned above, completely filling the space between hexagonal metal wall 220 and hexagonal metal column 240 is dielectric wall 230. The combination of hexagonal metal wall 220 as one electrode and hexagonal metal column 240 as the other electrode with dielectric wall 230 completely filling the space therebetween forms the invention's capacitor.

In the embodiment of the invention's capacitor shown in FIGS. 2B and 2C, interconnect metal layer one structure 233 and interconnect metal layer one segment 251 are made of copper. However, aluminum, tungsten, or other conductor material could be used instead of copper. Similarly, interconnect metal layer two structure 229 and interconnect metal layer two segment 247, interconnect metal layer three structure 225 and interconnect metal layer three segment 243, interconnect metal layer four structure 221 and interconnect metal layer four segment 239, and interconnect metal layer five structure 217 and interconnect metal layer five segment 235 are all made of copper, although they could be made of aluminum, tungsten or other conductor material.

Via metal structure 231 and via metal segment 249 are also made of copper; however, they could be made of tungsten. Similarly, via metal structure 227 and via metal segment 245, via metal structure 223 and via metal segment 241, and via metal structure 219 and via metal segment 237 are all made of copper, although they could be made of tungsten.

When copper is selected as the interconnect metal in a semiconductor fabrication process, interconnect metal structures 233, 229, 225, 221, and 217 in hexagonal metal wall 220 and interconnect metal segments 251, 247, 243, 239, and 235 in hexagonal metal column 240 are typically fabricated using a damascene process. In a damascene process, for each interconnect metal layer, the interconnect metal is laid into trenches formed into a dielectric layer. After the metal is laid into the dielectric trenches, the metal and the dielectric undergo a chemical mechanical polish ("CMP") process. The CMP process planarizes the surface of the dielectric and the in-laid interconnect metal and makes the in-laid interconnect metal substantially flush with the surface of the dielectric.

In a typical damascene process when copper is used as the interconnect metal, tungsten is used as the via metal. It is also possible to use copper as both the via metal and the interconnect metal. When copper is used as both the via metal and the interconnect metal, the process of choice may be a dual damascene process. In a dual damascene process, in addition to etching trenches into a dielectric to lay in interconnect metal, via holes are etched into a dielectric layer in order to lay copper into the via holes to make electrical connection to the underlying interconnect metal layer. Thus, when copper is used as the via metal in structures 231, 227, 223, and 219 of hexagonal metal wall 220 and in via metal segments 249, 245, 241, and 237 of hexagonal metal column 240, a dual damascene process can be used to fabricate the via metal segments and also to fabricate the interconnect metal structures.

Figure 2D:
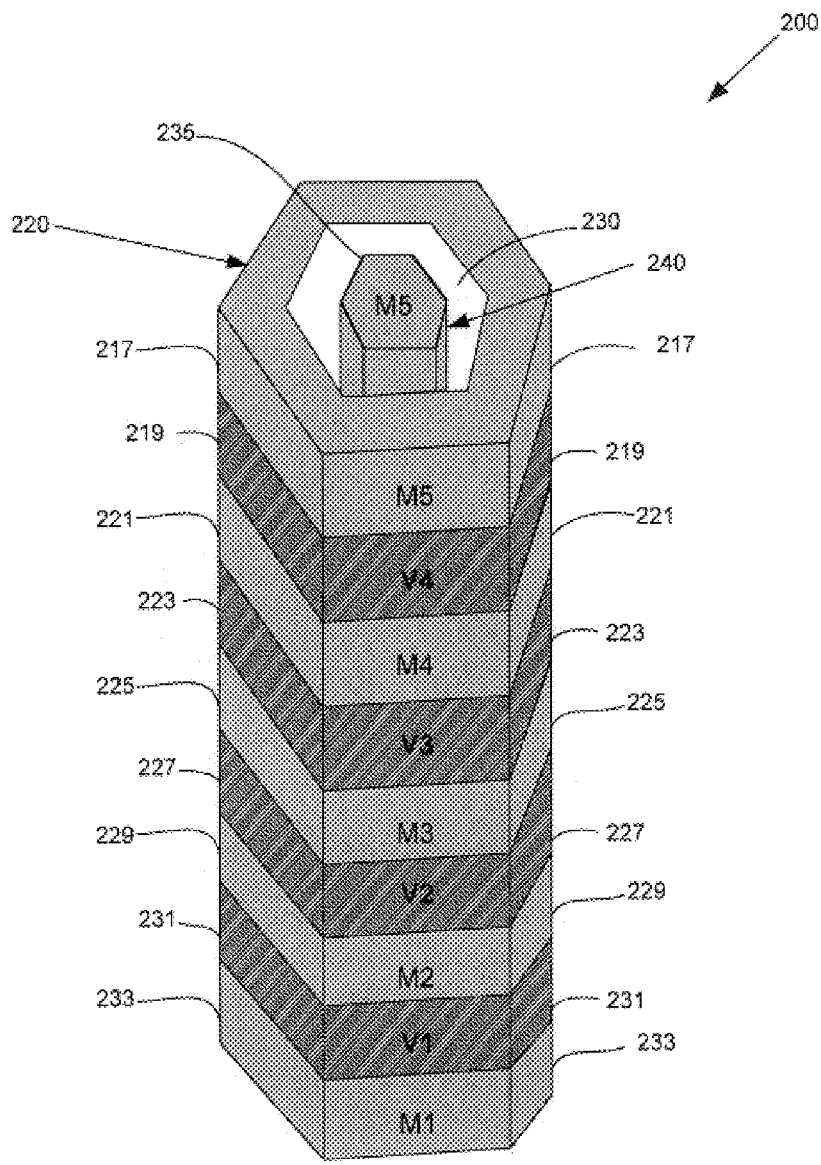
FIG. 2D shows a perspective view of one embodiment of the invention's capacitor.

As stated above, in the present embodiment of the invention's capacitor, continuous hexagonal vias are etched into the dielectric layer, i.e. the via metal structures would be hexagonal in shape and would be similar in configuration to the interconnect metal structures. By fabricating continuous hexagonal interconnect metal and via metal structures the capacitance density is improved. Referring to FIG. 2D, a three-dimensional view of the present invention's capacitor is shown. The hexagonal metal wall is generally referred to by numeral 220 while the hexagonal metal column is generally referred to by numeral 240. In FIG. 2D it is shown that hexagonal metal wall 220 is fabricated around hexagonal metal column 240. In this three-dimensional view, only the topmost interconnect metal layer segment of hexagonal metal column 240 can be seen which is referred to by numeral 235. The other lower interconnect metal layer segments and via metal segments of hexagonal metal column 240 cannot be seen in FIG. 2D.

In FIG. 2D, various interconnect metal structures and various via metal structures are shown. Structure 233 in hexagonal metal wall 220 is made of interconnect metal layer one, also marked as M1 in FIG. 2D, and forms the base of hexagonal metal wall 220. Structure 229 is made of interconnect metal layer two, also marked as M2 in FIG. 2D, and is connected to structure 233 through structure 231. Structure 231 is made from via metal, also marked as V1 in FIG. 2D, and connects structure 233 with structure 229. Structure 225 is made of interconnect metal layer three, also marked as M3 in FIG. 2D, and is connected to structure 229 through structure 227. Structure 227 is made from via metal, also marked as V2 in FIG. 2D, and connects structure 229 with structure 225. Structure 221 is made of interconnect metal layer four, also marked as M4 in FIG. 2D, and is connected to structure 225 through structure 223. Structure 223 is made from via metal, also marked as V3 in FIG. 2D, and connects structure 225 with structure 221.

Finally, structure 217 is made of interconnect metal layer five, also marked as M5 in FIG. 2D, and is connected to structure 221 through structure 219. Structure 219 is made from via metal, also marked as V4 in FIG. 2D, and connects structure 221 with structure 217. Structure 217 is the final structure in hexagonal metal wall 220 and completes hexagonal metal wall 220.

In FIG. 2D it is also seen that interconnect metal layer five structure of hexagonal metal wall 220, referred to by numeral 217, and interconnect metal layer five segment of hexagonal metal column 240, referred to by numeral 235, are constructed using the already available interconnect metal layer five. Similarly, interconnect metal layer four structure of hexagonal metal wall 220, referred to by numeral 221, and interconnect metal layer four segment of hexagonal metal column 240 (shown in FIG. 2C) are constructed using the already available interconnect metal layer four. Interconnect metal layer three structure of hexagonal metal wall 220, referred to by numeral 225, and interconnect metal layer three segment of hexagonal metal column 240 (shown in FIG. 2C) are constructed using the already available interconnect metal layer three. Interconnect metal layer two structure of hexagonal metal wall 220, referred to by numeral 229 and interconnect metal layer two segment of hexagonal metal column 240 (shown in FIG. 2C) are constructed using the already available interconnect metal layer two. Finally, interconnect metal layer one structure of hexagonal metal wall 220, referred to by numeral 233 and interconnect metal layer one segment of hexagonal metal column 240 (shown in FIG. 2C) are constructed using the already available interconnect metal layer one.

Similarly, the via metal structure of hexagonal metal wall 220, referred to by numeral 219 and the via metal segment of hexagonal metal column 240 (referred to in FIG. 2C by numeral 237), are constructed using a process already available and employed for fabricating a via between interconnect metal layer five and interconnect metal layer four. Similarly, the via metal structure of hexagonal metal wall 220, referred to by numeral 223 and the via metal segment of hexagonal metal column 240 (referred to in FIG. 2C by numeral 241) are constructed using a process already available and employed for fabricating a via between interconnect metal layer four and interconnect metal layer three. The via metal structure of hexagonal metal wall 220, referred to by numeral 227 and the via metal segment of hexagonal metal column 240 (referred to in FIG. 2C by numeral 245) are constructed using a process already available and employed for fabricating a via between interconnect metal layer three and interconnect metal layer two. Finally, the via metal structure of hexagonal metal wall 220, referred to by numeral 231 and the via metal segment of hexagonal metal column 240 (referred to in FIG. 2C by numeral 249) are constructed using a process already available and employed for fabricating a via between interconnect metal layer two and interconnect metal layer one.

By fabricating the present invention's capacitor using the various layers of interconnect metal already available in a semiconductor fabrication process and by using an already available via fabrication process, the present invention's capacitor does not increase fabrication costs. The fabrication of the present invention's capacitor requires no extra processing steps and no extra masks. In contrast, prior art capacitor 100 requires an extra mask and additional processing steps. The extra mask and additional processing steps increase fabrication costs of prior art capacitors, such as capacitor 100. Accordingly, the invention's capacitor is less costly to fabricate relative to prior art capacitors, such as capacitor 100 in FIG. 1.

Unlike capacitor 100 which has plates made of different conductive material, the present invention's capacitor uses the same metals for both hexagonal metal wall 220 and hexagonal metal column 240. In addition dielectric wall 230 in the invention's capacitor is relatively thick compared to dielectric 104 in capacitor 100. Thus, the capacitance of the invention's capacitor is relatively independent of the voltage applied to hexagonal metal wall 220 and hexagonal metal column 240, which act as the two electrodes of the invention's capacitor.

The density of capacitance is the amount of capacitance which can be packed into a unit area of the semiconductor chip. As described above, a typical prior art capacitance density on a semiconductor chip is about 1.0 fF per square micron. This is a disadvantage of prior art capacitors, such as capacitor 100, because prior art capacitors consume too much area on the semiconductor chip. In contrast to the prior art capacitor 100, shown in FIG. 1, the invention's capacitor provides a high capacitance density.

For a six metal layer process, the present embodiment of the invention's capacitor can provide a capacitance density of at least 1.8 fF per square micron. That is, the invention can provide an increase of at least 80% or more in capacitance density. This increase in capacitance density is achieved by fabricating hexagonal metal wall 220 and hexagonal metal column 240 of the invention's capacitor perpendicular to dielectric layer 208 and semiconductor substrate 210 using the various interconnect metal layers and via metal present on the semiconductor chip. By using this process, the semiconductor chip's area is used more efficiently, and a higher capacitance per square micron is attained. In addition, as discussed above, in contrast to capacitor 100, no extra masking step is required for this process, resulting in savings in fabrication costs.

As is well-known in the art, the number of metal layers fabricated on a semiconductor chip continually increases. The invention's principles can be even more advantageously applied as the number of metal layers increases. Some semiconductor manufacturers already fabricate ten metal layers and others are moving towards that goal. For example, with a ten metal layer process, using the tenth layer for interconnectivity, the capacitance density of the present invention's capacitor could be increased to approximately 4.0 fF per square micron.

In another embodiment of the invention's capacitor, capacitance density can be increased even further. Referring again to FIGS. 2B and 2C, in this embodiment, interconnect metal layer one structure 233 of hexagonal metal wall 220 would be connected to a contact structure (not shown in any of the Figures) within dielectric 208 and the contact structure itself would be connected to a polysilicon structure (not shown in any of the Figures) below dielectric 208. Likewise, interconnect metal layer one segment 251 of hexagonal metal column 240 would be connected to a contact segment (not shown in any of the Figures) within dielectric 208 and the contact segment itself would be connected to a polysilicon segment (not shown in any of the Figures) below dielectric 208. In one embodiment, the contact and polysilicon structures would also be fabricated with a hexagonal shape. In this manner, the "length" of the invention's capacitor's wall and the length of the invention's capacitor column are increased and as such the capacitance density of the invention's capacitor would increase.

Another reason for the increase in capacitance density according to the present embodiment of the invention is the existence of a metal wall which completely surrounds and encloses the capacitor's metal column. In capacitor 100 the flux lines at the fringes of capacitor plate 102 and capacitor plate 106 would extend to semiconductor substrate 110. This results in a loss of capacitance density in capacitor 100 as well as an unwanted parasitic capacitance.

In the invention's capacitor the electric field created between the metal wall and metal column is entirely enclosed within the capacitor. This results in a greater storage of energy in the invention's capacitor because the flux lines of the electric field terminate on the opposing electrode rather than extending to semiconductor substrate 210. Thus, the capacitance density of the invention's capacitor increases while the parasitic capacitance decreases.

Figure 3:
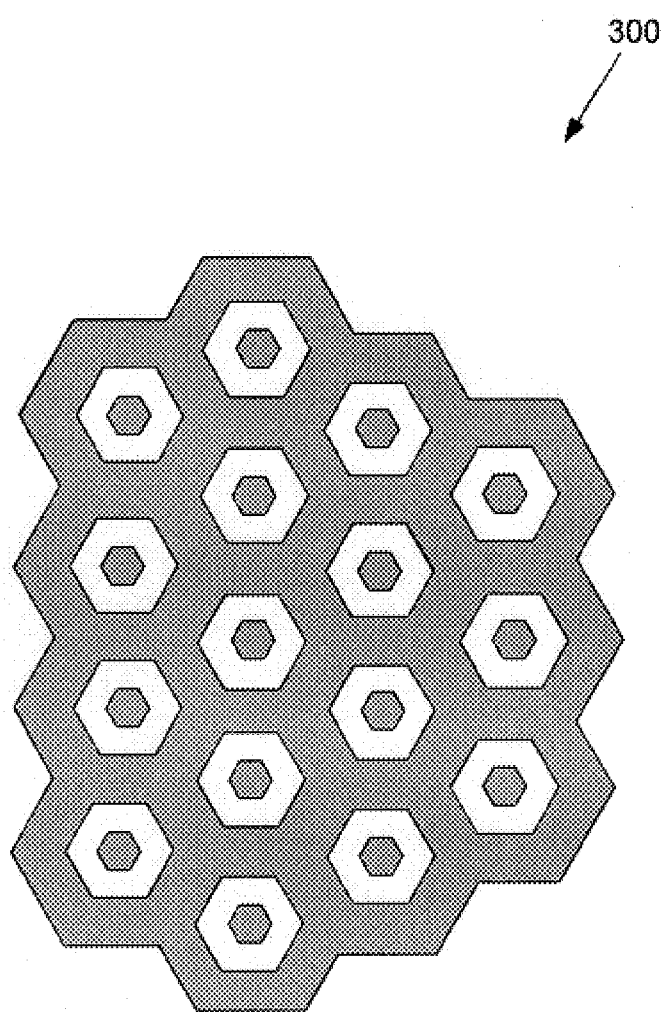
FIG. 3 shows one embodiment of the invention's composite capacitor formed by packing a number of individual capacitors into a cluster.

Yet another reason for the increase in capacitance density according to the invention is illustrated by referring to FIG. 3 which shows the top view of a cluster of the present invention's capacitors configured "wall to wall". This close packing of the invention's capacitors is made possible by the hexagonal configuration of the present embodiment of the invention's capacitor. This clustering of several capacitors together is referred to in the present application as "hexagonal packing" and also as a "honeycomb configuration". Some other possible configurations of the invention's capacitor, such as a circular configuration (as opposed to a hexagonal configuration), leave open spaces between the walls of the individual capacitors and as such do not result in optimal packing.

As discussed below, all the hexagonal metal walls of the invention's cluster of capacitors shown in FIG. 3 are electrically connected and are utilized as one electrode of the "overall capacitance." The cluster of capacitors shown in FIG. 3 is also referred to in the present application as a "composite capacitor" 300. As discussed below, all the hexagonal metal columns of the cluster of capacitors would be electrically connected and utilized as another electrode of the composite capacitor. Thus, the various individual capacitors act as one composite capacitor and there would be one composite capacitance.

Although not shown in any of the Figures, the individual hexagonal metal columns in the invention's composite capacitor 300 are electrically connected at a metal layer above the topmost metal layer of composite capacitor 300. Thus, in a six metal layer process, as used in the present embodiment of the invention, a sixth metal layer (not shown in any of the Figures) would be used to provide interconnectivity between the individual hexagonal metal columns shown in FIG. 3. Thus, in the present embodiment of the invention all the hexagonal metal columns of composite capacitor 300 in FIG. 3 would be electrically connected at the sixth metal layer and would be utilized as one electrode of composite capacitor 300. In another embodiment of the invention's composite capacitor shown in FIG. 3, the metal columns, such as hexagonal metal columns 240, can be interconnected to each other by a common polysilicon line which runs under dielectric layer 208 and would connect to each of the metal columns through a respective contact fabricated within dielectric layer 208.

It can also be seen in FIG. 3 that all the hexagonal metal walls of composite capacitor 300 are in contact with each other and are thus electrically connected. The hexagonal metal walls are utilized as another electrode of the composite capacitance provided by the honeycomb configuration of composite capacitor 300. In the present embodiment of the invention the connection to this electrode could be accessed at any interconnect metal structure or via metal segment of a hexagonal metal wall.

In a number of semiconductor applications, accurate "matching" of capacitors is necessary. As discussed above, capacitors are matched if their absolute values can be determined and replicated with accuracy. Matching of prior art capacitors is difficult since capacitance is a function of the thickness of the dielectric between the metal plates. Small variations in the thickness of the dielectric result in relatively large variations in the capacitance value. In contrast to the prior art capacitor 100, shown in FIG. 1, the invention's capacitor provides good matching characteristics.

The present invention's capacitor achieves better matching as a result of the hexagonal configuration of the individual capacitor. The "percent of matching" for two capacitors C1 and C2 is defined mathematically as $\Delta C/C_{ave.}$ and is expressed as a percentage, where $\Delta C$ is (C1−C2) and where $C_{ave.}$ is (C1+C2)/2.

Referring again to FIG. 2A, as discussed above, the distance between hexagonal metal wall 220 and hexagonal metal column 240 is referred to as distance S. Variations in distance S are due to natural process variations. As shown in FIG. 2A, distance S is the spacing between hexagonal metal wall 220 and hexagonal metal column 240. Distance S in FIG. 2A would correspond to "t" in FIG. 1, i.e., the distance between top plate 102 and bottom plate 106 of capacitor 100, also referred to in FIG. 1 by the numeral 104. In prior art capacitor 100, the capacitance varies inversely proportional to the thickness of dielectric 104 (i.e., 1/t). A typical percent matching achieved in the prior art capacitor 100 would be 0.25%.

In various embodiments of the invention's capacitor, the capacitance varies proportional to the natural logarithm of distance S, i.e. Ln S, which is a slower varying function than 1/t. Thus there is less variation in capacitance resulting from variations in distance S. In the embodiment of the present invention where the capacitor is configured as a hexagon, a typical percent matching would be roughly 0.17%. Because of the lower variation of capacitance resulting from the hexagonal configuration, process variations in distance S in the fabrication of the present invention's capacitor would not significantly affect the matching of the capacitors. As a result, the capacitors would have a closer absolute value of capacitance, i.e. there is a better capacitor matching from one capacitor to another.

Thus, there is a significant improvement in capacitor matching in the present embodiment of the invention's capacitor. The percent matching calculations for the hexagonal embodiment of the invention's capacitor shown in FIG. 2D are based on a circle approximation. The closer the configuration of the present invention's capacitor is to a circle, the better the matching characteristics of the capacitor will be. However, although a circular configuration would provide better matching, the hexagonal configuration allows tighter packing of individual capacitors. This tight hexagonal packing achieves a higher overall capacitance density for the composite capacitor as compared to a cluster of packed circular capacitors. Thus, the hexagonal configuration of the present invention's capacitor is a means to achieve both good matching and higher capacitance density.

The present invention's capacitor also has a higher break down voltage than prior art capacitor 100 because dielectric wall 230 of the invention's capacitor is relatively thick compared to the thickness of the dielectric used in the prior art capacitor 100. As known in the art, a thicker capacitor dielectric is less likely to break down in response to a given voltage applied to the electrodes of the capacitor.

As explained above, the invention's capacitor has overcome the present need for a capacitor in semiconductor chips by achieving a high capacitance density, good matching characteristics, a high break down voltage, good linearity and a reduced fabrication cost.

Thus, structure and method for fabrication of an improved capacitor have been described.

What is claimed is:

1. A capacitor comprising:

an interconnect metal segment;

an interconnect metal structure surrounding and enclosing said interconnect metal segment;

a dielectric situated between said interconnect metal segment and said interconnect metal structure, said dielectric being surrounded and enclosed by said interconnect metal structure;

said interconnect metal structure being a first electrode in said capacitor;

said interconnect metal segment being a second electrode in said capacitor.

2. The capacitor of claim 1 wherein said interconnect metal segment is fabricated from metal selected from the group consisting of copper and aluminum.

3. The capacitor of claim 1 wherein said interconnect metal structure is fabricated from metal selected from the group consisting of copper and aluminum.

4. The capacitor of claim 1 wherein said dielectric comprises silicon oxide.

5. The capacitor of claim 1 wherein said interconnect metal structure is shaped as a hexagon.

6. A capacitor comprising:

a metal column, said metal column comprising an interconnect metal segment contacting a via metal segment;

a metal wall surrounding and enclosing said metal column;

said metal wall comprising an interconnect metal structure contacting a via metal structure;

a dielectric situated between said metal column and said metal wall, said dielectric being surrounded and enclosed by said metal wall;

said metal wall being a first electrode of said capacitor;

said metal column being a second electrode of said capacitor.

7. The capacitor of claim 6 wherein said interconnect metal segment is fabricated from metal selected from the group consisting of copper and aluminum.

8. The capacitor of claim 6 wherein said interconnect metal structure is fabricated from metal selected from the group consisting of copper and aluminum.

9. The capacitor of claim 6 wherein said via metal segment is fabricated from metal selected from the group consisting of copper and tungsten.

10. The capacitor of claim 6 wherein said via metal structure is fabricated from metal selected from the group consisting of copper and tungsten.

11. The capacitor of claim 6 wherein said dielectric comprises silicon oxide.

12. The capacitor of claim 6 wherein said metal wall is shaped as a hexagon.

13. A composite capacitor in a semiconductor chip comprising:

a first capacitor having a first interconnect metal structure surrounding and enclosing a first interconnect metal segment;

a second capacitor having a second interconnect metal structure surrounding and enclosing a second interconnect metal segment;

said first interconnect metal structure being connected to said second interconnect metal structure, said first interconnect metal structure and said second interconnect metal structure being a first electrode of said composite capacitor;

said first interconnect metal segment being connected to said second interconnect metal segment, said first interconnect metal segment and said second interconnect metal segment being a second electrode of said composite capacitor.

14. The composite capacitor of claim 13 wherein said first and second interconnect metal segments are fabricated from metal selected from the group consisting of copper and aluminum.

15. The composite capacitor of claim 13 wherein said first and second interconnect metal structures are fabricated from metal selected from the group consisting of copper and aluminum.

16. The composite capacitor of claim 13 wherein said first and second interconnect metal structures have a hexagonal shape.

* * * * *